(12) United States Patent
Lin et al.

(10) Patent No.: US 11,695,416 B2
(45) Date of Patent: *Jul. 4, 2023

(54) LEVEL SHIFTER

(71) Applicant: Taiwan Semiconductor Manufacturing Company, Ltd., Hsinchu (TW)

(72) Inventors: Wan-Yen Lin, Kaohsiung (TW); Chia-Hui Chen, Hsinchu (TW); Chia-Jung Chang, Hsinchu (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 0 days.

This patent is subject to a terminal disclaimer.

(21) Appl. No.: 17/503,903

(22) Filed: Oct. 18, 2021

(65) Prior Publication Data

US 2022/0149837 A1 May 12, 2022

Related U.S. Application Data

(63) Continuation of application No. 16/804,099, filed on Feb. 28, 2020, now Pat. No. 11,152,937.
(Continued)

(51) Int. Cl.
*H03K 19/0175* (2006.01)
*H03K 17/689* (2006.01)
(Continued)

(52) U.S. Cl.
CPC ..... *H03K 17/689* (2013.01); *H03K 3/356104* (2013.01); *H03K 19/0175* (2013.01);
(Continued)

(58) Field of Classification Search
CPC ....... H03K 19/0175; H03K 19/017509; H03K 19/017527; H03K 19/0185;
(Continued)

(56) References Cited

U.S. PATENT DOCUMENTS 8,283,964 B2   10/2012   Cassia
9,806,716 B2 *  10/2017   Dey ................... H03K 19/0013
(Continued)

FOREIGN PATENT DOCUMENTS

KR    10-2010-0016050 A    2/2010
KR    10-2012-0051026 A    5/2012

*Primary Examiner* — Long Nguyen
(74) *Attorney, Agent, or Firm* — Merchant & Gould P.C.

(57) ABSTRACT

A level shifter includes an input circuit having first and second input terminals configured to receive complementary input signals at a first voltage level and a second voltage level. A cross-latch circuit is coupled to the input circuit, and has first and second output terminals configured to provide complementary output signals at a third voltage level and a fourth voltage level. The input circuit includes first and second control nodes configured to output first and second control signals at the first voltage level and the fourth voltage level based on the input signals. A tracking circuit is coupled to the input circuit and the cross-latch circuit, and is configured to input first and second tracking signals to the cross-latch circuit based on the first and second control signals, wherein the first tracking signal is the greater of the first control signal and the third voltage level, and the second tracking signal is the greater of the second control signal and the third voltage level.

20 Claims, 10 Drawing Sheets

Related U.S. Application Data

(60) Provisional application No. 62/855,363, filed on May 31, 2019.

(51) Int. Cl.
*H03K 3/356* (2006.01)
*H03K 19/0185* (2006.01)

(52) U.S. Cl.
CPC ............... *H03K 19/017509* (2013.01); *H03K 19/018507* (2013.01); *H03K 19/018514* (2013.01)

(58) Field of Classification Search
CPC ... H03K 19/018507; H03K 19/018514; H03K 19/018521; H03K 19/018528; H03K 17/689; H03K 3/356104
See application file for complete search history.

(56) References Cited

U.S. PATENT DOCUMENTS 11,152,937 B2 * 10/2021 Lin .................. H03K 3/356
2016/0036441 A1 * 2/2016 Dey ............... H03K 19/018521
326/63

* cited by examiner

LEVEL SHIFTER

CROSS-REFERENCE TO RELATED APPLICATIONS

This application is a continuation of application Ser. No. 16/804,099, filed Feb. 28, 2020, now U.S. Pat. No. 11,152,937, which application claims the benefit of provisional application Ser. No. 62/855,363 titled "High-Speed Over-Drive Level Shifter Circuit" filed May 31, 2019, which applications are incorporated herein by reference in their entirety.

BACKGROUND

Many electronic devices, such as desktop computers, laptop computers, tablets, smartphones, etc., employ multiple integrated circuits, often in conjunction with multiple discrete semiconductor devices, to process and store information. Some electronic devices use multiple voltage levels to correspondingly power their multiple integrated circuits and discrete semiconductor devices. Voltage level shifters may be employed to shift and adapt voltage levels of digital signals between integrated circuits using different voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
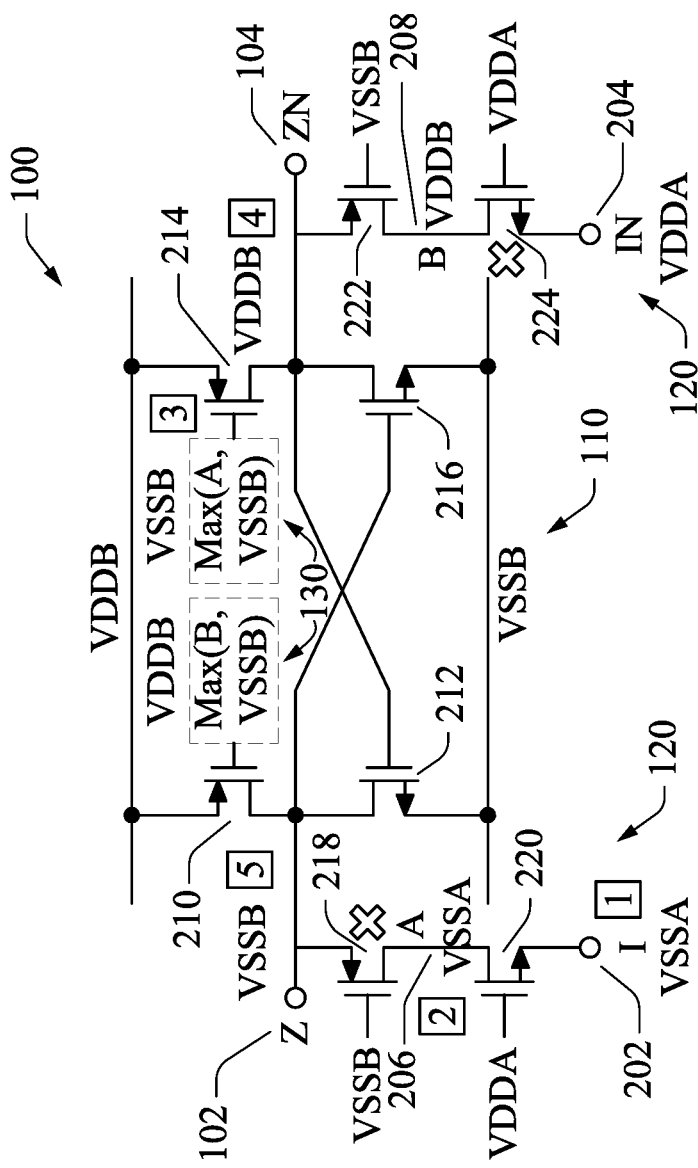
FIG. 1 is a circuit diagram illustrating an example of a level shifter in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram illustrating aspects of an over-drive level shifter 100 in accordance with disclosed embodiments. The level shifter 100 includes a cross latch circuit 110, an input circuit 120 and a tracking circuit 130. The input circuit receives complementary input signals I and IN in a first voltage domain A and is therefore connected to VDDA and VSSA voltage signals. The cross-latch circuit 110 operates in a second voltage domain B and is therefore connected to VDDB and VSSB voltage signals. In some implementations, the first voltage levels VDDA and VSSA can be equal to 1.8V and 0V (ground), respectively, while the second voltage levels VDDB and VSSB can be equal to 3.3V and 1.8V, respectively. In other examples, VDDA and VSSA can be equal to 1.2V and 0V (ground), respectively, while second voltage levels VDDB and VSSB can be equal to 1.8V and 0.6V, respectively. In other words, the voltage levels VDDA and VSSB are at the same voltage level, and in effect the level shifter 100 is connected to receive three voltage levels: VSSA, VDDA/VSSB, and VDDB. Other voltage levels are within the scope of the disclosure.

The cross-latch circuit 110 provides complementary output signals Z and ZN. A cross-latch circuit generally operates in a single voltage domain (VDD, VSS). Thus, the output signals Z, ZN swing between low and high states in this single voltage domain. Disclosed embodiments employ the cross-latch circuit 110 in an over-drive level shifter circuit. As such, the input signals I and IN are in the lower, first voltage domain and thus swing between the VDDA and VSSA voltage levels, while the outputs Z and ZN are shifted to the higher second voltage domain and thus swing between VDDB and VSSB.

To provide enhanced performance and reliability, a tracking circuit 130 outputs overdrive, or tracking signals to the cross-latch circuit 110 that are based on the input signals I and IN, rather than apply the complementary input signals I and IN in the first voltage domain directly to the cross-latch circuit 110. More particularly, the tracking circuit 130 is configured to provide tracking signals to the cross-latch circuit 110 that are the greater of the control signal A and the VSSB voltage level, or the greater of the control signal B and the VSSB voltage level. In other words, the tracking signals are provided in the second voltage domain, even though the control signals A,B could be in the first or second voltage domain.

In the illustrated example, input terminals 202 and 204 receive complementary input signals I and IN, respectively, in the first voltage domain, while output terminals 102 and 104 provide complementary output signals Z, ZN in the second voltage domain. As shown in FIG. 1, the input circuit 120 is connected between the input terminals 202 and 204, which receive signals in the first (lower) voltage domain A, and the output terminals 102 and 104, which output signals in the second (higher) voltage domain B. The control signals A and B, which are output at nodes 206 and 208, respectively, thus can swing between the low VSSA signal of the first voltage domain, and the high VDDB signal of the second voltage domain.

The cross latch circuit 110 includes a first pair of transistors including a first transistor 210 and a second transistor 212 connected in series, and a second pair of transistors including a third transistor 214 and a fourth transistor 216 connected in series. The first and third transistors 210, 214 are PMOS transistors and the second and fourth transistors 212, 216 are NMOS transistors in the illustrated example. The two pairs of transistors are connected between VDDB and VSSB voltage rails. In the example shown, the gate terminal of the transistor 216 is connected to the output terminal 102, which is at a junction of source/drain terminals the first pair of transistors 210,212, while the gate terminal of the transistor 212 is connected to the output terminal 104, which is at a junction of source/drain terminals of the second pair of transistors 214, 216.

The level shifter 100 further includes the input circuit 120, which includes series-connected transistors 218 and 220 connected between the output terminal 102 and the input terminal 202, as well as series-connected transistors 222 and 224 connected between the output terminal 104 and the input terminal 204. In the illustrated example, transistors 218 and 222 are PMOS transistors and transistors 220 and 224 are NMOS transistors. Control signals A and B at the respective nodes 206 and 208 are received by the tracking circuit 130, which is connected to gate terminals of the PMOS transistors 214 and 210 of the latch circuit 110. More specifically, the tracking circuit is configured such that the gate of the PMOS transistor 210 receives tracking signals that are the higher of the control signal B or VSSB, while the gate of the PMOS transistor 214 receives the higher of control signal A or VSSB.

The gate terminals of the NMOS transistors 220, 224 are coupled to receive the VDDA voltage signals, and the gate terminals of the PMOS transistors 218, 220 are coupled to receive the VSSB voltage signals. As noted above, in some embodiments VDDA and VSSB are the same voltage level. When the input signal I transitions from logic high to low in the first voltage domain, for example, the input signal I at the input terminal 202 is at the VSSA voltage level. The NMOS transistor 220 turns on with the VDDA signal at its gate, pulling the control signal A at the node 206 to low (VSSA).

The tracking circuit 130 is configured such that the PMOS transistor 214 of the cross-latch 110 receives the higher of the control signal A signal or VSSB. Accordingly, the gate of the PMOS transistor receives the low VSSB signal (logic low in the second voltage domain), turning on the PMOS transistor 214. This pulls the ZN signal to logic high in the second voltage domain (VDDB) at the output terminal 104. The high ZN signal further turns on the NMOS transistor 212, pulling the Z signal low in the second voltage domain (VSSB) at the output terminal 102. The low Z signal further turns off the NMOS transistor 216 to latch the ZN output signal in its high state.

Figure 2:
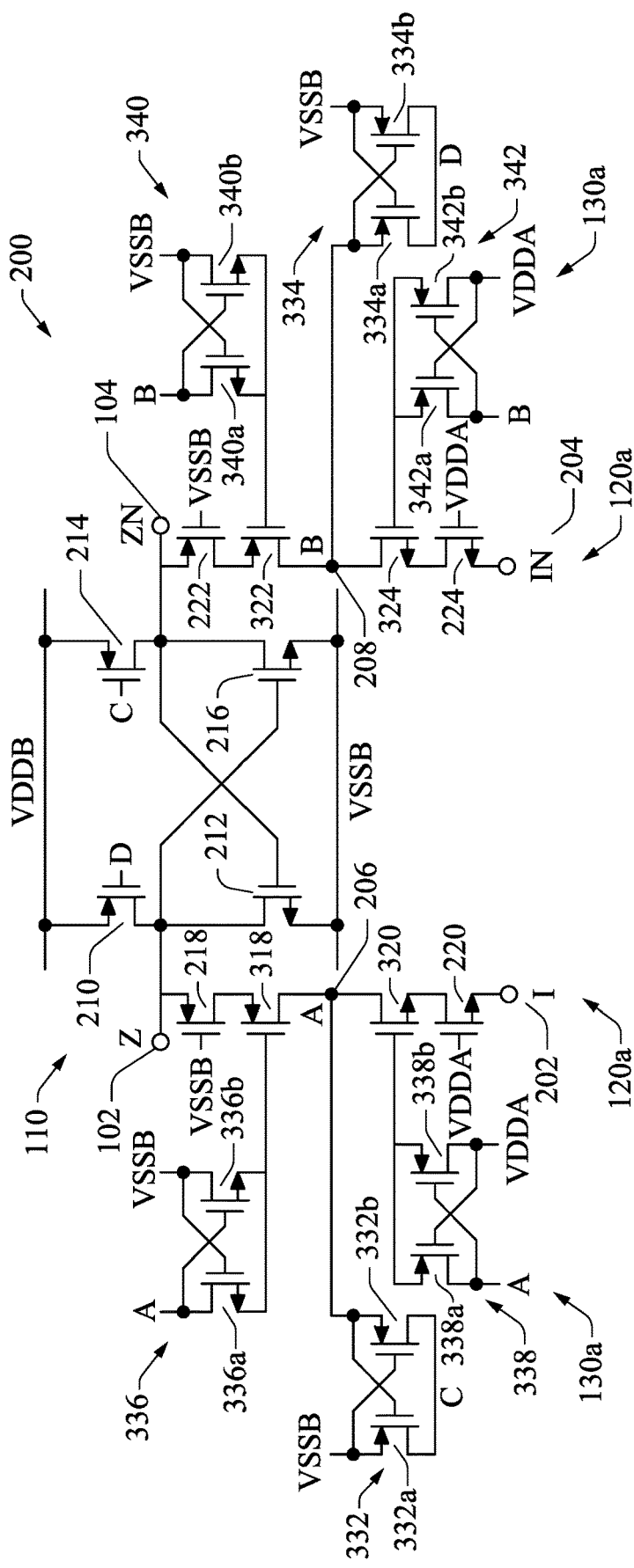
FIG. 2 is a circuit diagram illustrating the level shifter including alternative examples of an input circuit and a tracking circuit in accordance with some embodiments.

As noted above, the PMOS transistors 210, 214 of the cross-latch circuit 110 are controlled by the tracking circuit 130, with the gate of the PMOS transistor 210 receiving the higher of the control signal B or VSSB, and the gate of the PMOS transistor 214 receiving the higher of the control signal A or VSSB. FIG. 2 depicts an example level shifter 200, illustrating further aspects of an embodiment of the tracking circuit 130*a* that is configured to compare the A and B signals to VSSB and output the appropriate tracking signals C and D to the PMOS transistors 214 and 210, respectively.

The cross-latch circuit 110 shown in FIG. 2 is similar to that shown in FIG. 1, and thus includes the first transistor 210 and second transistor 212 connected in series, and the third transistor 214 and a fourth transistor 216 connected in series. The first and third transistors 210, 214 are PMOS transistors and the second and fourth transistors 212, 216 are NMOS transistors. The two pairs of transistors are connected between the VDDB and VSSB voltage rails. The gate terminal of the transistor 216 is connected to the output terminal 102, while the gate terminal of the transistor 212 is connected to the output terminal 104. The PMOS transistors 210 and 214 receive the D and C tracking signals, respectively, from the tracking circuit 130*a* as discussed further below.

Similarly to the input circuit 120 shown in FIG. 1, the input circuit 120*a* of FIG. 2 includes the PMOS transistor 218 and the NMOS transistor 220 connected between the output terminal 102 and the input terminal 202, and the PMOS transistor 222 and NMOS transistor 224 connected between the output terminal 104 and the input terminal 204. The gates of the PMOS transistors 218, 222 are connected to the VSSB signal, and the gates of the NMOS transistors 220 and 224 are connected to the VDDA signal. Additionally, a PMOS transistor 318 is connected between the control node 206 and the PMOS transistor 218, and an NMOS transistor 320 is connected between the control node 206 and the NMOS transistor 220. Similarly, a PMOS transistor 322 is connected between the control node 208 and the PMOS transistor 222, and an NMOS 324 transistor is connected between the control node 208 and the NMOS transistor 224.

As noted above in conjunction with FIG. 1, the tracking circuit 130*a* shown in FIG. 2 is configured so that the gate of the PMOS transistor 210 receives the higher of the control signal B or VSSB, while the gate of the PMOS transistor 214 receives the higher of the control signal A or VSSB. The tracking circuit 130*a* includes a cross-coupled PMOS transistor pair 332, including PMOS transistors 332*a* and 332*b*, configured to output a tracking signal C that is the greater of the control signal A or VSSB, and a cross-coupled PMOS transistor pair 334, including PMOS transistors 334*a* and 334*b*, configured to output a tracking signal D that is the greater of the control signal B or VSSB. Accordingly, the source terminals of the PMOS transistors 332*a* and 334*a* are coupled to receive the VSSB signal, while the source terminals of the PMOS transistors 332*b* and 334*b* are coupled to receive the control nodes 206 and 208, respectively, to receive the A and B control signals. The tracking signal C is received at the gate of the PMOS transistor 214, and the tracking signal D is received at the gate of the PMOS transistor 210.

The embodiment shown in FIG. 2 includes additional cross-coupled transistor pairs for generating the A and B control signals. More particularly, cross-coupled NMOS transistor pairs 336 and 340 provide respective control signals to gates of the PMOS transistors 318 and 322. The cross-coupled NMOS transistor pair 336 includes NMOS transistors 336a and 336b, which have their drains connected to the control signal A and VSSB, respectively. The cross-coupled NMOS transistor pair 340 includes NMOS transistors 340a and 340b, which have their drains connected to the control signal B and VSSB, respectively. The sources of the cross-coupled transistor pairs 336 and 340 are connected to the gates of the PMOS transistors 318 and 322, respectively.

Cross-coupled PMOS transistor pairs 338 and 342 provide respective control signals to gates of the NMOS transistors 320 and 324. The cross-coupled PMOS transistor pair 338 includes PMOS transistors 338a and 338b, which have their drains connected to the control signal A and VDDA, respectively. The cross-coupled PMOS transistor pair 342 includes PMOS transistors 342a and 342b, which have their drains connected to the control signal B and VDDA, respectively. The sources of the cross-coupled transistor pairs 338 and 342 are connected to the gates of the NMOS transistors 320 and 324, respectively.

Thus, when the input signal I transitions from logic high to low in the first voltage domain, the input signal I at the input terminal 202 is at the VSSA voltage level (e.g., 0V). The series-connected NMOS transistors 220, 320 turn on, pulling the control signal A at the node 206 to low (VSSA). The low control signal A is input to the cross-coupled PMOS transistor pair 332, along with VSSB, to output the tracking signal C at the VSSB voltage level to the gate of the PMOS transistor 214. This pulls the ZN signal to logic high in the second voltage domain (VDDB) at the output terminal 104. The high ZN signal further turns on the NMOS transistor 212, pulling the Z signal low in the second voltage domain (VSSB) at the output terminal 102. The low Z signal further turns off the NMOS transistor 216 to latch the ZN output signal in its high state.

Figure 3:
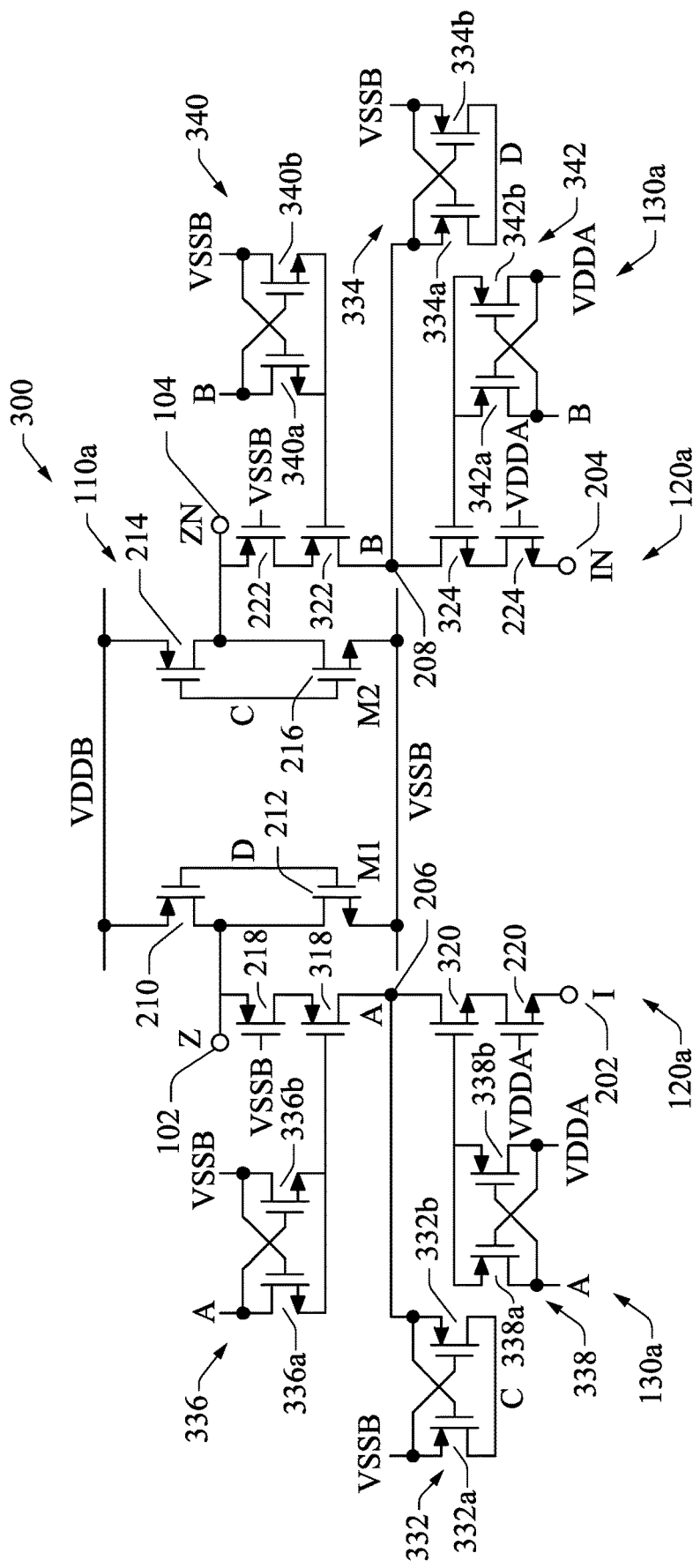
FIG. 3 is a circuit diagram illustrating the level shifter including an alternative example of a cross-latch circuit in accordance with some embodiments.

FIG. 3 illustrates another example level shifter 300, illustrating further aspects of an embodiment of the cross-latch circuit 110a. In FIG. 3, the C and D control signals are received at the gates of each of the latch transistors 210, 212, 214, and 216. In contrast, the example shown in FIG. 2 has the output terminals 102 and 104 cross-coupled to the gates of the NMOS transistors 216 and 212, respectively. Thus, in the example shown in FIG. 3, the tracking signals C or D directly control each of the latch transistors 210, 212, 214, and 216 to increase operation speed of the level shifter 300.

As in the example shown in FIG. 2, the input signals I, IN are received at the input terminals 202, 204 of the input circuit 120a. The cross-latch circuit 110a includes the PMOS transistor 210 and NMOS transistor 212 connected in series, and the PMOS transistor 214 and NMOS transistor 216 connected in series. The two pairs of transistors are connected between the VDDB and VSSB voltage rails. As noted above, the gate terminals of the transistors 210 and 212 are connected to receive the tracking signal D, and the gate terminals of the transistors 214 and 216 are connected to receive the tracking signal C.

The PMOS transistors 218 and 318 are connected between the output terminal 102 and the control node 206, and the PMOS transistors 222 and 322 are connected between the output terminal 104 and the control node 208. The NMOS transistors 220 and 320 are connected between the control node 206 and the input terminal 202, and the NMOS transistors 224 and 324 are connected between the control node 208 and the input terminal 204. The gates of the PMOS transistors 218, 222 are connected to the VSSB signal, and the gates of the NMOS transistors 220 and 224 are connected to the VDDA signal. The PMOS transistors 318 and 322 have their gates connected to the outputs of the cross-coupled NMOS pairs 336 and 340, respectively. The NMOS transistors 320 and 324 have their gates connected to the outputs of the cross-coupled PMOS pairs 338 and 342, respectively.

The cross-coupled PMOS transistors pairs 332 and 334 are connected to the control nodes 206 and 208, respectively and are configured to output the tracking signals C and D, respectively. When the input signal I transitions from logic high to low in the first voltage domain, the input signal I at the input terminal 202 is at the VSSA voltage level (e.g., 0V). The series-connected NMOS transistors 220, 320 turn on, pulling the control signal A at the node 206 to low (VSSA). The low control signal A is input to the cross-coupled PMOS transistor pair 332, along with VSSB, to output the tracking signal C at the VSSB voltage level to the gates of the PMOS transistor 214 and NMOS transistor 216. This turns on the PMOS transistor 214 and turns off the NMOS transistor 216, pulling the ZN signal to logic high in the second voltage domain (VDDB) at the output terminal 104. The tracking signal D turns on the NMOS transistor 212 and turns off the PMOS transistor 210, pulling the Z signal low in the second voltage domain (VSSB) at the output terminal 102.

Figure 4:
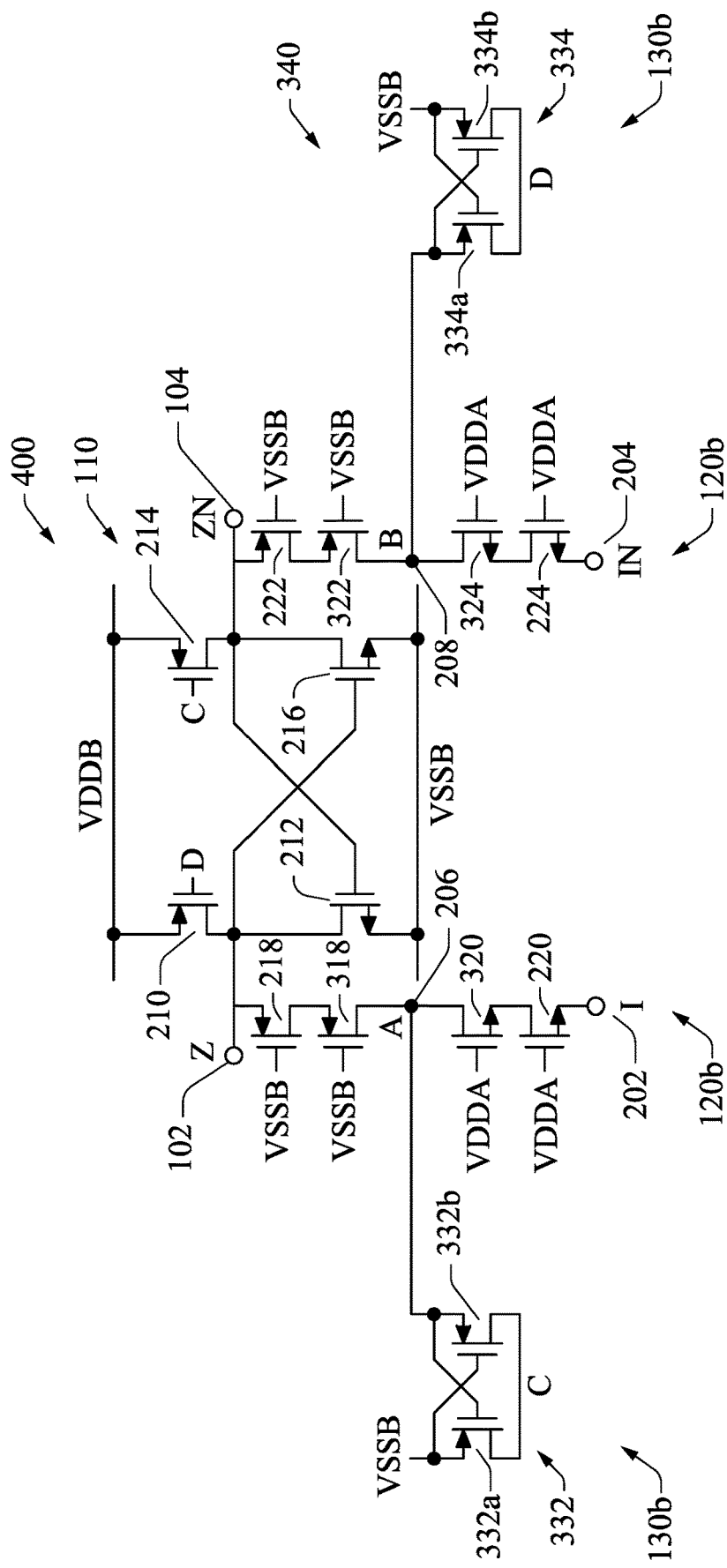
FIG. 4 is a circuit diagram illustrating the level shifter including alternative examples of the input circuit and the tracking circuit in accordance with some embodiments.

FIG. 4 illustrates an example level shifter 400 that includes the cross-latch circuit 110 shown in FIG. 1, with an input circuit 120b and a tracking circuit 130b in accordance with further embodiments. As with the example shown in FIG. 1, the cross-latch circuit 110 of FIG. 4 includes the PMOS transistor 210 and NMOS transistor 212 connected in series, and the PMOS transistor 214 and NMOS transistor 216 connected in series. The two pairs of transistors are connected between the VDDB and VSSB voltage rails. The gate terminal of the transistor 216 is connected to the output terminal 102, while the gate terminal of the transistor 212 is connected to the output terminal 104. The PMOS transistors 210 and 214 receive the D and C control signals, respectively, from the tracking circuit 130b.

The input circuit 120b of FIG. 4 includes the PMOS transistors 218 and 318 connected between the output terminal 102 and the control node 206, and the PMOS transistors 222 and 322 connected between the output terminal 104 and the control node 208. The NMOS transistors 220 and 320 are connected between the control node 206 and the input terminal 202, and the NMOS transistors 224 and 324 are connected between the control node 208 and the input terminal 204. The gates of the PMOS transistors 218, 222 are connected to the VSSB signal, and the gates of the NMOS transistors 220 and 224 are connected to the VDDA signal.

In the tracking circuit 130b of FIG. 4, the cross-coupled transistor pairs connected to the gates of PMOS transistors 318 and 322 and the gates of the NMOS transistors 320 and 324 are omitted. Instead, PMOS transistors 318 and 322 of the input circuit 120b also have their gates connected to receive the VSSB signal, and the NMOS transistors 320 and 324 also have their gates connected to receive the VDDA signals. Some alternative embodiments may eliminate the transistors 318, 320, 322 and 324.

As with the tracking circuit 130a of FIG. 3, the tracking circuit 130b includes the cross-coupled PMOS transistors pairs 332 and 334 connected to the control nodes 206 and 208, respectively, configured to output the tracking signals C and D, respectively. When the input signal I transitions from logic high to low in the first voltage domain, the input signal I at the input terminal 202 is at the VSSA voltage level (e.g., 0V). The series-connected NMOS transistors 220, 320 turn on, pulling the control signal A at the node 206 to low (VSSA). The low control signal A is input to the cross-coupled PMOS transistor pair 332, along with VSSB, to output the tracking signal C at the VSSB voltage level to the gate of the PMOS transistor 214. This turns on the PMOS transistor 214, pulling the ZN signal to logic high in the second voltage domain (VDDB) at the output terminal 104. The tracking signal D turns off the PMOS transistor 210, pulling the Z signal low in the second voltage domain (VSSB) at the output terminal 102. The output terminals 102 and 104 are cross-coupled to the gates of the NMOS transistors 216 and 212, respectively, to latch the Z and ZN signals.

Figure 5:
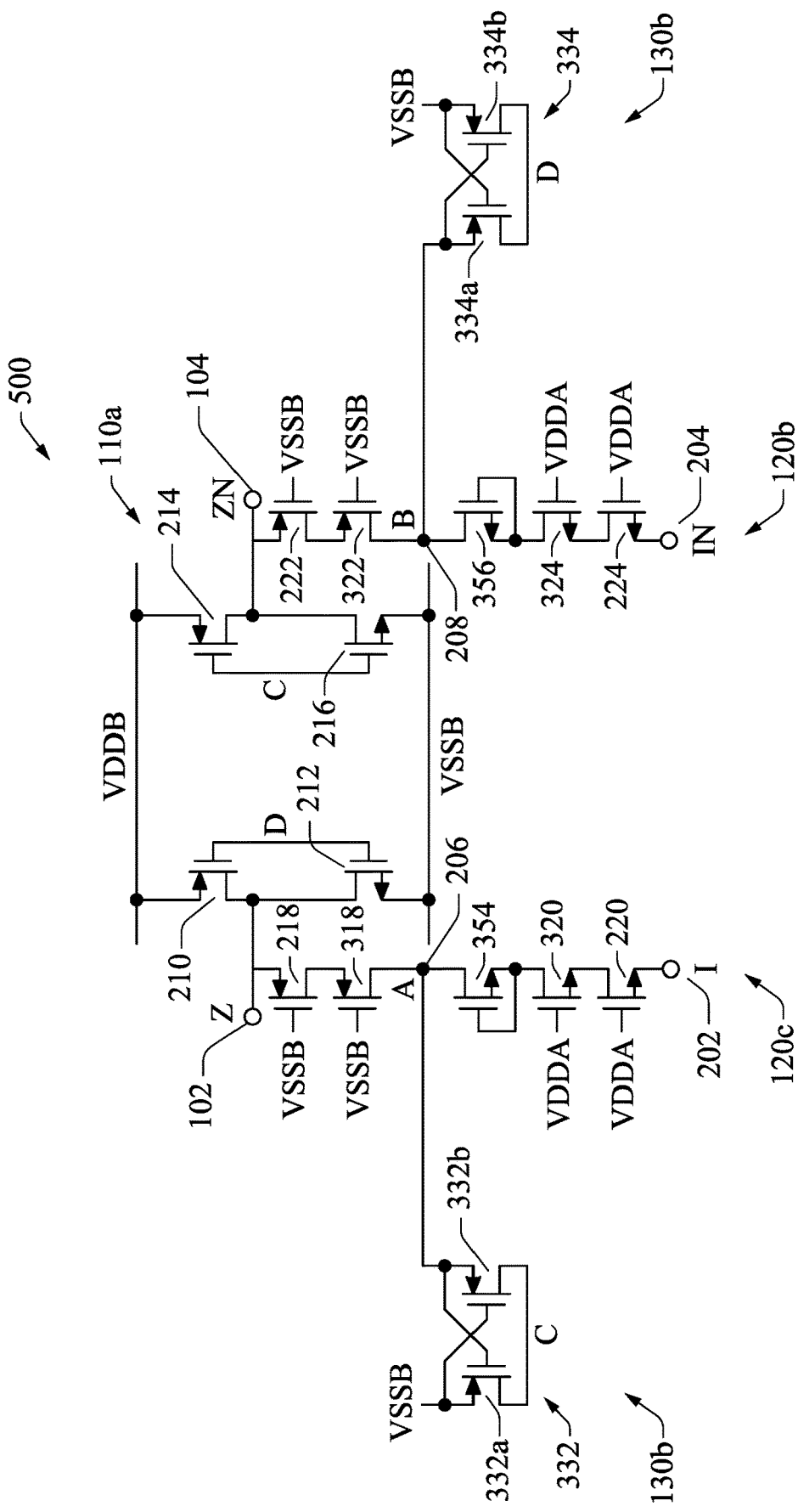
FIG. 5 is a circuit diagram illustrating the level shifter including an alternative example of the input circuit in accordance with some embodiments.

FIG. 5 illustrates another embodiment of a level shifter 500 in which the cross-latch circuit 110a and the tracking circuit 130b are combined with an input circuit 120c. The input circuit 120c includes the PMOS transistors 218 and 318 connected between the output terminal 102 and the control node 206, and the PMOS transistors 222 and 322 connected between the output terminal 104 and the control node 208. The NMOS transistors 220 and 320 are connected between the control node 206 and the input terminal 202, and the NMOS transistors 224 and 324 are connected between the control node 208 and the input terminal 204. The gates of the PMOS transistors 218, 318, 222 and 322 are connected to the VSSB signal, and the gates of the NMOS transistors 220, 320, 224 and 324 are connected to the VDDA signal.

Additionally, the input circuit 120c includes diodes connected between the control nodes A and B and respective transistors 320 and 324. In the example illustrated in FIG. 5, the diodes are diode-connected NMOS transistors 354, 356, though other diode structures are within the scope of the disclosure.

As noted above, with the cross-latch circuit 110a, the C and D control signals are received at the gates of each of the latch transistors 210, 212, 214, and 216. The tracking signals C or D thus directly control each of the latch transistors 210, 212, 214, and 216 to increase operation speed of the level shifter 100. The cross-coupled PMOS transistors pairs 332 and 334 of the tracking circuit 130b are connected to the control nodes 206 and 208, respectively, configured to output the tracking signals C and D, respectively.

Figure 6:
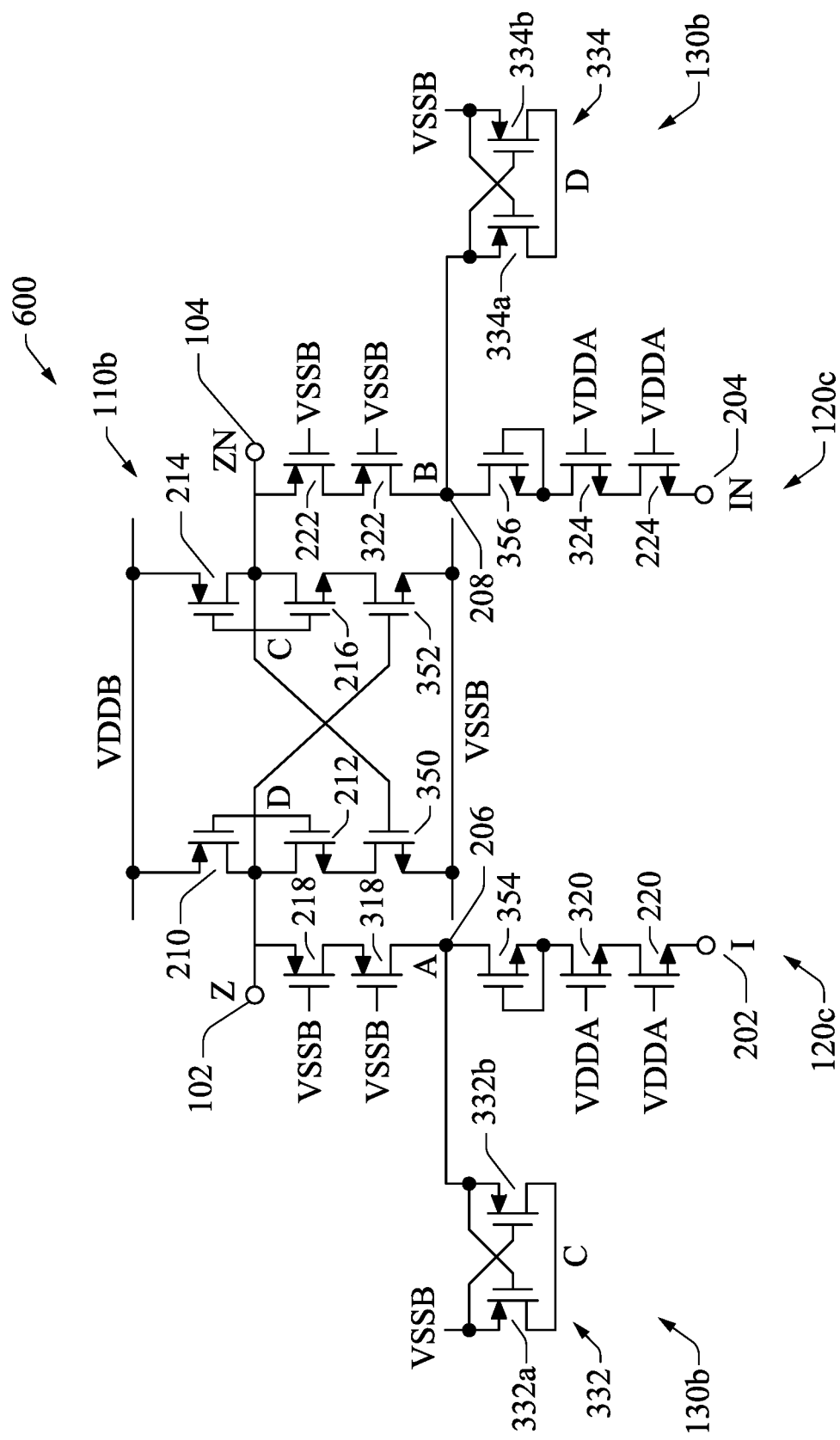
FIG. 6 is a circuit diagram illustrating the level shifter including an alternative example of the cross-latch circuit in accordance with some embodiments.

FIG. 6 illustrates a further example in which the input circuit 120c and tracking circuit 130b are used with another example cross-latch circuit 110b. The input circuit 120c in FIG. 6 includes the PMOS transistors 218 and 318 connected between the output terminal 102 and the control node 206, and the PMOS transistors 222 and 322 connected between the output terminal 104 and the control node 208. NMOS transistors 220 and 320 are connected between the control node 206 and the input terminal 202, and NMOS transistors 224 and 324 are connected between the control node 208 and the input terminal 204. The gates of the PMOS transistors 218, 318, 222 and 322 are connected to the VSSB signal, and the gates of the NMOS transistors 220, 320, 224 and 324 are connected to the VDDA signal. The cross-coupled PMOS transistors pairs 332 and 334 of the tracking circuit 130b are connected to the control nodes 206 and 208, respectively, configured to output the tracking signals C and D, respectively. The tracking signals C and D are received at the gates of each of the cross-latch transistors 210, 212, 214, and 216. Diodes are connected between the control nodes A and B and respective transistors 320 and 324. In the example illustrated in FIG. 6, the diodes are the diode-connected NMOS transistors 354, 356, though other diode structures are within the scope of the disclosure.

The cross-latch circuit 110b further includes NMOS transistors 350 and 352. The transistor 350 is connected in series between the NMOS transistor 212 and the VSSB rail, and the transistor 352 is connected in series between the NMOS transistor 216 and the VSSB rail. The gates of the NMOS transistors 350 and 352 are cross-coupled to the output terminals 104 and 102 respectively, to latch the signals Z and ZN in their complementary states.

Figure 7:
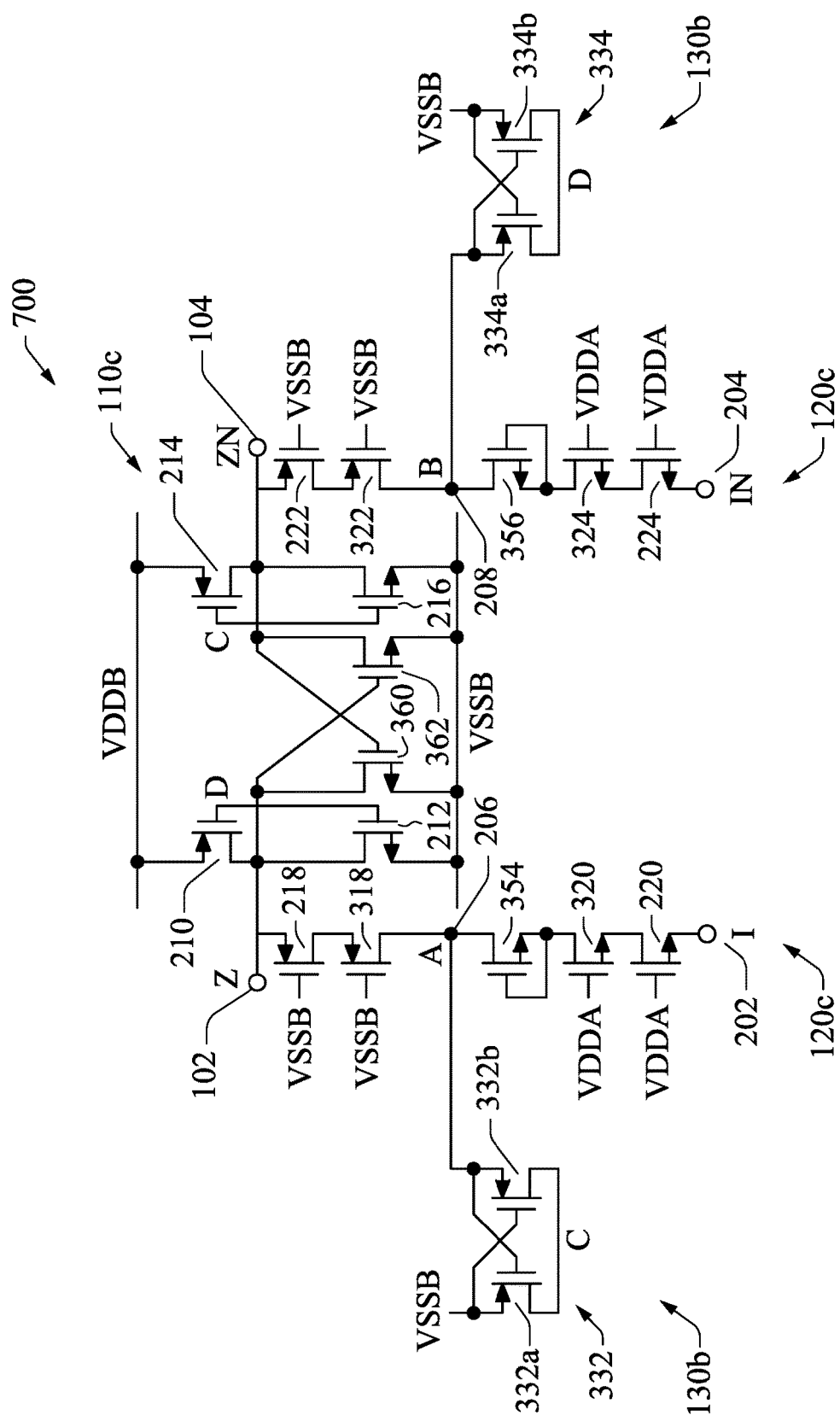
FIG. 7 is a circuit diagram illustrating the level shifter including another alternative example of the cross-latch circuit in accordance with some embodiments.

FIG. 7 illustrates another example in which the input circuit 120c and tracking circuit 130b are used with a still further example cross-latch circuit 110c. The input circuit 120c includes the PMOS transistors 218 and 318 connected between the output terminal 102 and the control node 206, and the PMOS transistors 222 and 322 connected between the output terminal 104 and the control node 208. NMOS transistors 220 and 320 are connected between the control node 206 and the input terminal 202, and NMOS transistors 224 and 324 are connected between the control node 208 and the input terminal 204. The gates of the PMOS transistors 218, 318, 222 and 322 are connected to the VSSB signal, and the gates of the NMOS transistors 220, 320, 224 and 324 are connected to the VDDA signal.

The cross-coupled PMOS transistors pairs 332 and 334 of the tracking circuit 130b are connected to the control nodes 206 and 208, respectively, configured to output the tracking signals C and D, respectively. The tracking signals C and D are received at the gates of each of the cross-latch transistors 210, 212, 214, and 216. The diode-connected NMOS transistors 354, 356 are connected between the control nodes A and B and respective transistors 320 and 324, though other diode structures are within the scope of the disclosure.

The cross-latch circuit 110c further includes NMOS transistors 360 and 362. The transistor 360 is connected in parallel between the NMOS transistor 212 and the VSSB rail, and the transistor 362 is connected in series between the NMOS transistor 216 and the VSSB rail. The gates of the NMOS transistors 360 and 362 are cross-coupled to the output terminals 104 and 102 respectively, to latch the signals Z and ZN in their complementary states.

Figure 8:
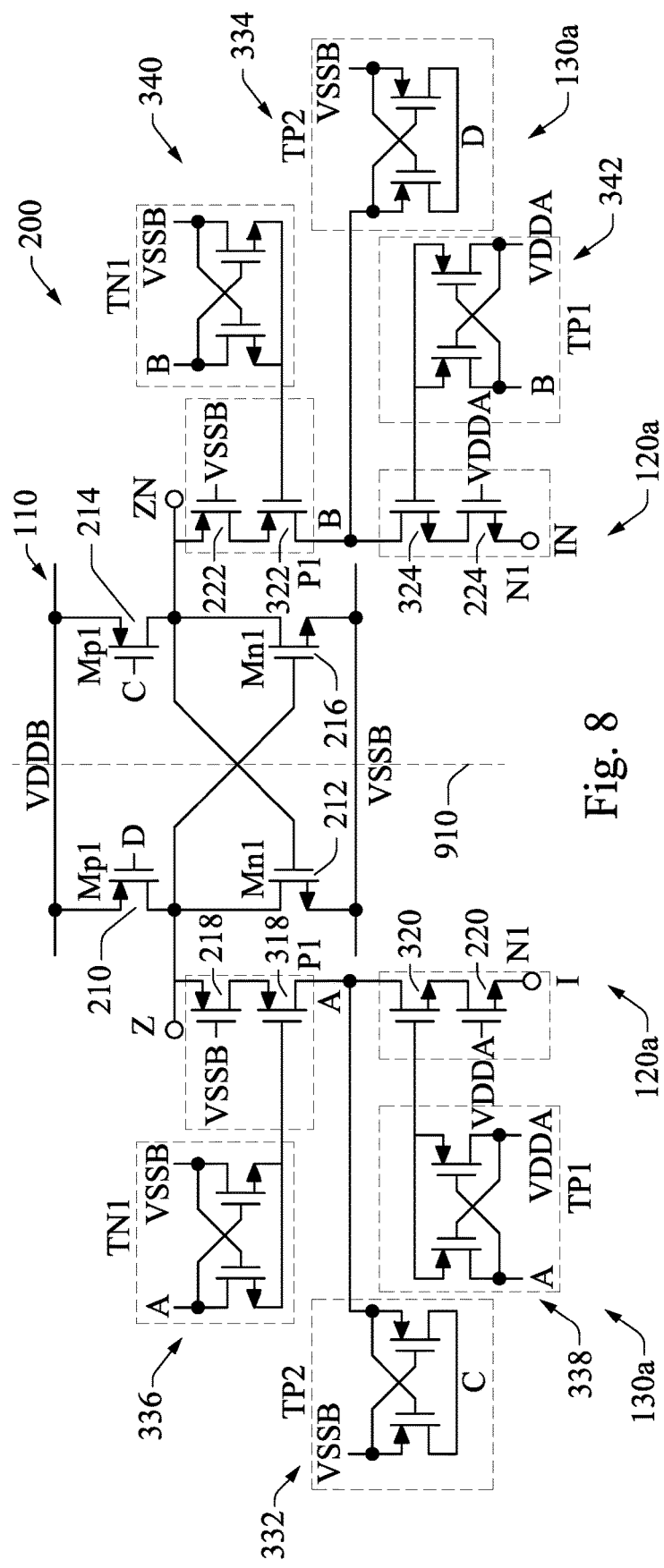
FIG. 8 is a circuit diagram illustrating the level shifter of FIG. 2 with various NMOS and PMOS components identified in accordance with some embodiments.

FIGS. 8-11 depict example level shifter layouts in accordance with some embodiments. FIG. 8 illustrates the level shifter 200 of FIG. 2, with the cross coupled PMOS transistor pairs 338 and 342 of the tracking circuit 130a labeled "TP1," and the cross coupled PMOS transistor pairs 332 and 334 of the tracking circuit 130a labeled "TP2." The NMOS transistor pairs 336 and 340 of the tracking circuit 130a are labeled "TN1" in FIG. 8. The PMOS transistors 218, 318, 222 and 322 of the input circuit 120a are labeled P1, and the NMOS transistors 220, 320, 224 and 324 of the input circuit 120a are labeled N1. The PMOS transistors 210 and 214 of the cross-latch circuit 110 are labeled Mp1, and the NMOS transistors 212 and 216 of the cross-latch circuit 110 are labeled Mn1.

Figure 9:
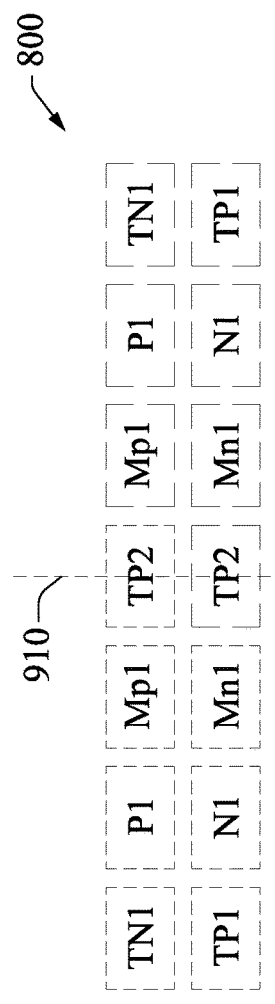
FIG. 9 is a block diagram illustrating aspects of a symmetrical layout for the level shifter of FIG. 8 in accordance with some embodiments.
Figure 11:
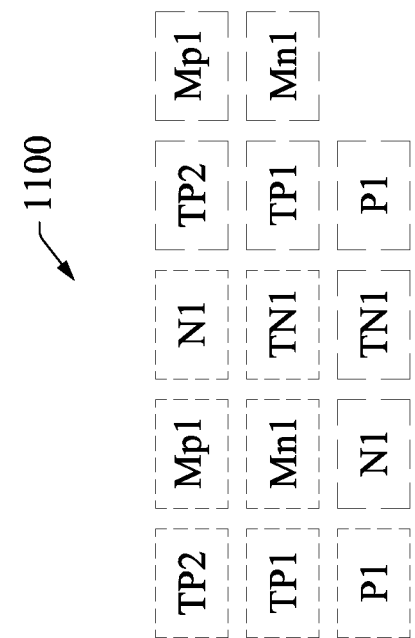
FIG. 11 is a block diagram illustrating aspects of a nonsymmetrical layout for the level shifter of FIG. 8 in accordance with some embodiments.
Figure 10:
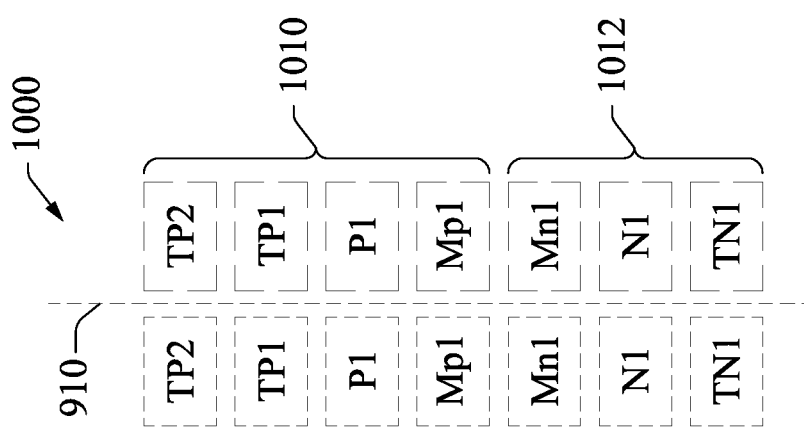
FIG. 10 is a block diagram illustrating aspects of another symmetrical layout for the level shifter of FIG. 8 in accordance with some embodiments.

FIG. 9 shows an example symmetrical layout 900 for the level shifter 200, where the TN1, TP1, P1, N1, Mp1, Mn1, and TP2 transistors are arranged symmetrically horizontally on either side of a center line 910. FIG. 10 illustrates another symmetrical layout 1000 in which the TN1, TP1, P1, N1, Mp1, Mn1, and TP2 transistors are arranged symmetrically vertically on either side of the center line 910. Additionally, in some examples, the NMOS and PMOS components on each side of the centerline 910 may be grouped together on their respective sides of the centerline 910 to simplify the manufacturing process. This is shown in the example layout 1000, where the PMOS transistors TP2, TP1, P1, and Mp1 are all located at the upper portion 1010 of the layout 1000, while the NMOS transistors Mn1, N1, and TN1 are all located at the lower portion 1012 of the layout 1000. Still further, the transistors TN1, TP1, P1, N1, Mp1, Mn1, and TP2 can be re-arranged in other layout locations as long as the symmetry is maintained. Such symmetric layouts are balanced and allow the outputs to toggle at the same speed, and thus improving performance. FIG. 11 illustrates an example of a nonsymmetrical layout, where NMOS and PMOS components are not necessarily symmetrically grouped about a centerline. Such nonsymmetrical layouts may be suitable, for example, for lower speed implementations. Other symmetrical and nonsymmetrical layouts are within the scope of the disclosure.

Figure 12:
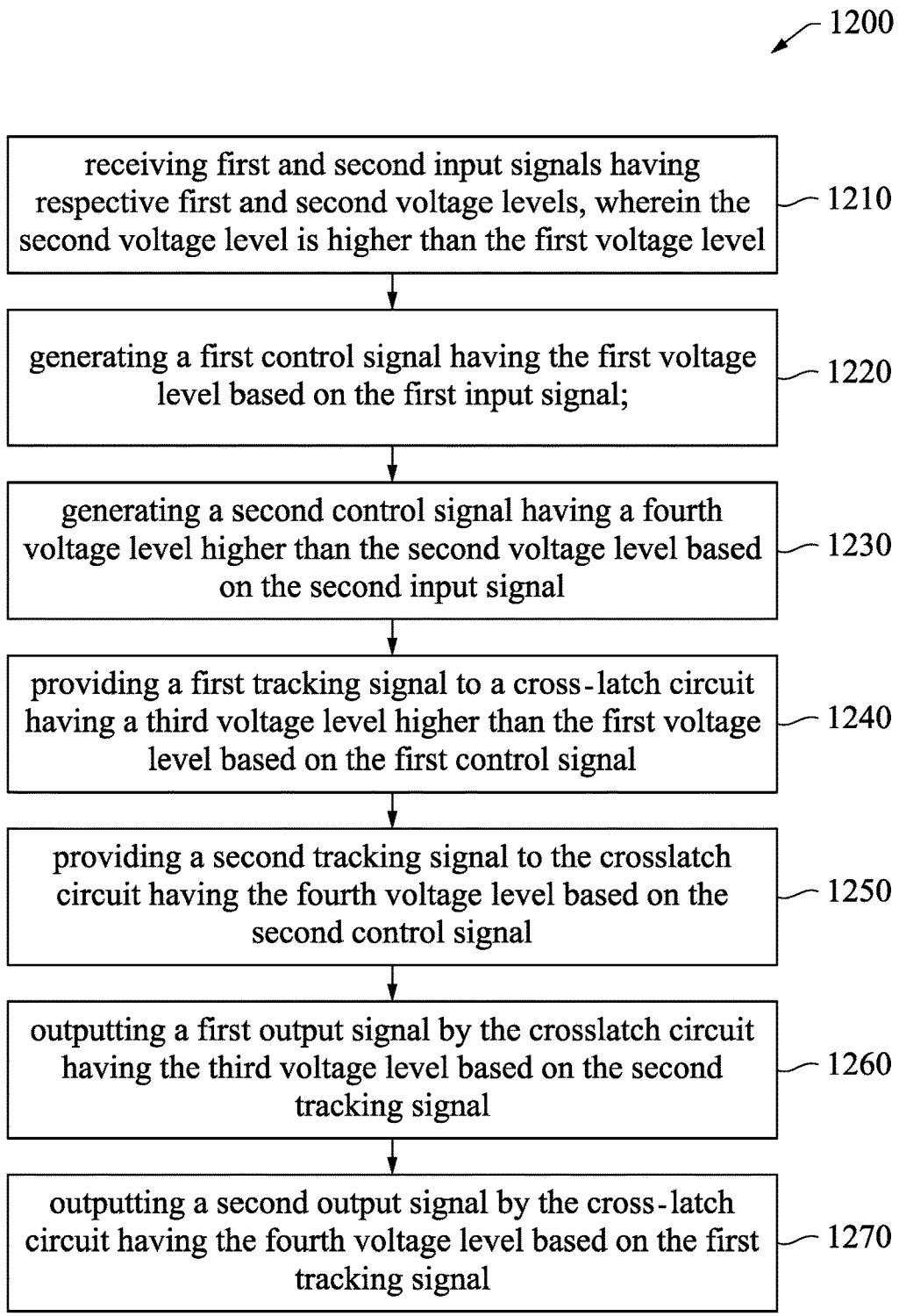
FIG. 12 is a flow diagram illustrating a level shifting method in accordance with some embodiments.

FIG. 12 is a flow diagram illustrating an example of a level shifting method 1200 in accordance with some embodiments. The method 1200 could be implemented in conjunction with any of the example level shifter circuits disclosed herein. Referring to FIG. 12 in conjunction with FIGS. 1-7, at step 1210 first and second input signals I, IN having respective first and second voltage levels VSSA, VDDA are received at the input terminals 202, 204 of the level shifter 100. In the illustrated example, the second voltage level VDDA is higher than the first voltage level VSSA. A first control signal A having the first voltage level VSSA, which is based on the first input signal I, is generated at step 1220. At step 1230, a second control signal B is generated based on the second input signal IN. The second control signal B is at a fourth voltage level VDDB, which is higher than the second voltage level VDDA.

In step 1240, a first tracking signal C based on the first control signal A is provided to a cross-latch circuit 120. The first tracking signal C has a third voltage level VSSB higher than the first voltage VSSA level. A second tracking signal D based on the second control signal B is provided to the cross-latch circuit 120 in step 1250. The second tracking signal D has the fourth voltage level VDDB. A first output signal Z based on the second tracking signal D having the third voltage level VSSB is output by the cross-latch circuit 120 in step 1260, and a second output signal ZN based on the first tracking signal C having the fourth voltage level VDDB is output by the cross-latch circuit 120 in step 1270.

The high-speed over-drive level shifter device describes in the embodiments above utilizes a cross latch to perform the level shifting. This allows the structure to be used for 2×VDD and 3×VDD applications. For instance, embodiments disclosed herein may provide higher speed toggling rates while maintaining or improving system reliability. Some examples provide operating speeds at 250 MHz.

In accordance with some disclosed examples, a level shifter includes an input circuit having first and second input terminals configured to receive complementary input signals at a first voltage level and a second voltage level. A cross-latch circuit is coupled to the input circuit. The cross-latch circuit has first and second output terminals configured to provide complementary output signals at a third voltage level and a fourth voltage level. The input circuit includes first and second control nodes configured to output first and second control signals at the first voltage level and the fourth voltage level based on the input signals. A tracking circuit is coupled to the input circuit and the cross-latch circuit, and is configured to input first and second tracking signals to the cross-latch circuit based on the first and second control signals. The first tracking signal is the greater of the first control signal and the third voltage level, and the second tracking signal is the greater of the second control signal and the third voltage level.

Other disclosed examples include a level shifter that has first and second input terminals configured to receive complementary first and second input signals in a low voltage domain, and first and second output terminals configured to provide complementary first and second output signals corresponding to the first and second input signals in a high voltage domain. An input circuit is connected between the first and second input terminals and the first and second output terminals. The input circuit has first and second control nodes configured to output first and second control signals in the high and low voltage domains based on the first and second input signals. A cross-latch circuit is coupled to the input circuit and the first and second output terminals, and includes first and second input terminals. A tracking circuit is coupled to the first and second control nodes and the first and second input terminals of the cross-latch circuit. The tracking circuit is configured to provide first and second tracking signals to the first and second input signals of the cross-latch circuit in the high voltage domain based on the first and second control signals.

In accordance with further examples, a method includes receiving first and second input signals having respective first and second voltage levels, wherein the second voltage level is higher than the first voltage level. A first control signal is generated having the first voltage level based on the first input signal, and a second control signal is generated having a fourth voltage level higher than the second voltage level based on the second input signal. A first tracking signal is provided to a cross-latch circuit having a third voltage level higher than the first voltage level based on the first control signal. A second tracking signal is provided to the cross-latch circuit having the fourth voltage level based on the second control signal. A first output signal is output by the cross-latch circuit having the third voltage level based on the second tracking signal, and the cross-latch circuit outputs a second output signal having the fourth voltage level based on the first tracking signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A level shifter, comprising:
   first and second input terminals configured to receive complementary first and second input signals of a low voltage domain;
   first and second output terminals configured to provide complementary first and second output signals of a high voltage domain;

an input circuit coupled between the first and second input terminals and the first and second output terminals, and further coupled with control nodes configured to provide first and second control signals based on the complementary first and second input signals, wherein providing the first and second control signals includes providing the lower of the complementary first and second input signals as the first or second control signal;

a tracking circuit coupled with the control nodes, and configured to generate first and second tracking signals based on the first and second control signals, wherein the tracking circuit is configured to output the first tracking signal according to which is greater of the first control signal and a low voltage of the high voltage domain, and wherein the tracking circuit is configured to output the second tracking signal according to which is greater between the second control signal and the low voltage of the high voltage domain; and a cross-latch circuit coupled with the tracking circuit, and configured to provide the complementary first and second output signals of the high voltage domain to the first and second output terminals based on the tracking signals.

2. The level shifter of claim 1, wherein in response to the complementary first and second input signals toggling, the cross-latch circuit is configured to change a state of the complementary first and second output signals with a voltage swing between the low voltage of the high voltage domain and a high voltage of the high voltage domain.

3. The level shifter of claim 2, wherein the first and second tracking signals are provided in the high voltage domain, and the first and second control signals are provided in either the high voltage domain or the low voltage domain.

4. The level shifter of claim 3, wherein the first and second control signals are configured to swing between a low voltage of the low voltage domain and the high voltage of the high voltage domain.

5. The level shifter of claim 4, wherein the low voltage of the high voltage domain and the high voltage of the low voltage domain are approximately equal.

6. The level shifter of claim 5, wherein the high voltage of the high voltage domain is approximately 3.3V, the low voltage of the high voltage domain and the high voltage of the low voltage domain are approximately 1.8V, and the low voltage of the low voltage domain is ground.

7. The level shifter of claim 1, wherein the cross-latch circuit includes:

a first PMOS transistor and a first NMOS transistor connected in series between a high voltage of the high voltage domain and the low voltage of the high voltage domain, wherein a junction of the first PMOS transistor and the first NMOS transistor forms the first output terminal, wherein a gate terminal of the first PMOS transistor is connected to receive the second tracking signal; and a second PMOS transistor and a second NMOS transistor connected in series between the high voltage of the high voltage domain and the low voltage of the high voltage domain, wherein a junction of the second PMOS transistor and the second NMOS transistor forms the second output terminal, wherein a gate terminal of the second PMOS transistor is connected to receive the first tracking signal.

8. The level shifter of claim 7, wherein:
the first output terminal is connected to a gate terminal of the second NMOS transistor;

the second output terminal is connected to a gate terminal of the first NMOS transistor; and the cross-latch circuit is configured to latch the complementary first and second output signals.

9. The level shifter of claim 7, wherein the tracking circuit includes:

a first cross-coupled PMOS transistor pair having a first input connected to the low voltage of the high voltage domain, a second input connected to a first control node to receive the first control signal, and an output node configured to output the first tracking signal to the gate terminal of the second PMOS transistor of the cross-latch circuit; and a second cross-coupled PMOS transistor pair having a first input connected to the low voltage of the high voltage domain, a second input connected to a second control node to receive the second control signal, and an output node configured to output the second tracking signal to the gate terminal of the first PMOS transistor of the cross-latch circuit.

10. The level shifter of claim 1, wherein the input circuit includes:

a first PMOS transistor and a first NMOS transistor connected in series between the first output terminal and the first input terminal, wherein a junction of the first PMOS transistor and the first NMOS transistor forms a first control node, wherein a gate terminal of the first PMOS transistor is connected to the low voltage of the high voltage domain, and wherein a gate terminal of the first NMOS transistor is connected to a high voltage of the low voltage domain, and wherein a source of the first NMOS transistor is connected to the first input terminal; and a second PMOS transistor and a second NMOS transistor connected in series between the second output terminal and the second input terminal, wherein a junction of the second PMOS transistor and the second NMOS transistor forms a second control node, wherein a gate terminal of the second PMOS transistor is connected to the low voltage of the high voltage domain, and wherein a gate terminal of the second NMOS transistor is connected to the high voltage of the low voltage domain, and wherein a source of the second NMOS transistor is connected to the second input terminal.

11. A level shifter, comprising:

first and second input terminals configured to receive complementary first and second input signals of a low voltage domain;

first and second control nodes configured to provide first and second control signals based on the complementary first and second input signals, wherein the first and second control signals are provided in either the low voltage domain or a high voltage domain, and wherein providing the first and second control signals includes providing the lower of the complementary first and second input signals as the first or second control signal;

a tracking circuit including a first cross-coupled PMOS transistor pair configured to output a first tracking signal according to which is greater between the first control signal and a low voltage of the high voltage domain, and a second cross-coupled PMOS transistor pair configured to output a second tracking signal according to which is greater between the second control signal and the low voltage of the high voltage domain; and a cross-latch circuit including a first PMOS transistor and a first NMOS transistor connected in series between a high voltage of the high voltage domain and the low voltage of the high voltage domain, and a second PMOS transistor and a second NMOS transistor connected in series between the high voltage of the high voltage domain and the low voltage of the high voltage domain, wherein a gate terminal of the first PMOS transistor is connected to receive the second tracking signal, wherein a gate terminal of the second PMOS transistor is connected to receive the first tracking signal, and wherein the cross-latch circuit is configured to output complementary first and second output signals in the high voltage domain based on the first tracking signal and the second tracking signal.

12. The level shifter of claim 11, wherein:
a junction of the first PMOS transistor and the first NMOS transistor forms a first output terminal; and
a junction of the second PMOS transistor and the second NMOS transistor forms a second output terminal.

13. The level shifter of claim 12, wherein:
the first output terminal is connected to a gate terminal of the second NMOS transistor;
the second output terminal is connected to a gate terminal of the first NMOS transistor; and
the cross-latch circuit is configured to latch the complementary first and second output signals.

14. The level shifter of claim 12, further comprising an input circuit including:
a first PMOS transistor and a first NMOS transistor connected in series between the first output terminal and the first input terminal, wherein a junction of the first PMOS transistor and the first NMOS transistor forms the first control node, wherein a gate terminal of the first PMOS transistor is connected to the low voltage of the high voltage domain, and wherein a gate terminal of the first NMOS transistor is connected to a high voltage of the low voltage domain; and
a second PMOS transistor and a second NMOS transistor connected in series between the second output terminal and the second input terminal, wherein a junction of the second PMOS transistor and the second NMOS transistor forms the second control node, wherein a gate terminal of the second PMOS transistor is connected to the low voltage of the high voltage domain, and wherein a gate terminal of the second NMOS transistor is connected to the high voltage of the low voltage domain.

15. The level shifter of claim 14, wherein the input circuit further includes:
a third PMOS transistor connected in series between the first PMOS transistor and the first control node;
a fourth PMOS transistor connected in series between the second PMOS transistor and the second control node;
a third NMOS transistor connected in series between the first NMOS transistor and the first control node; and
a fourth NMOS transistor connected in series between the second NMOS transistor and the second control node.

16. The level shifter of claim 11, wherein:
the first cross-coupled PMOS transistor pair of the tracking circuit includes a first input connected to the low voltage of the high voltage domain, a second input connected to the first control node to receive the first control signal, and an output node configured to output the first tracking signal; and
the second cross-coupled PMOS transistor pair of the tracking circuit includes a first input connected to the low voltage of the high voltage domain, a second input connected to the second control node to receive the second control signal, and an output node configured to output the second tracking signal.

17. The level shifter of claim 14, wherein a source of the first NMOS transistor of the input circuit is connected to the first input terminal, and wherein a source of the second NMOS transistor of the input circuit is connected to the second input terminal.

18. A method for level shifting, the method comprising:
receiving, at first and second input terminals, complementary first and second input signals of a low voltage domain;
providing, at first and second control nodes, first and second control signals based on the complementary first and second input signals, wherein the first and second control signals are provided in either the low voltage domain or a high voltage domain, and wherein providing the first and second control signals includes providing the lower of the complementary first and second input signals as the first or second control signal;
generating, with a tracking circuit, first and second tracking signals based on the first and second control signals;
outputting the first tracking signal to a cross-latch circuit according to which is greater between the first control signal and a low voltage of the high voltage domain;
outputting the second tracking signal to the cross-latch circuit according to which is greater between the second control signal and the low voltage of the high voltage domain; and
outputting, with the cross-latch circuit, complementary first and second output signals in the high voltage domain based on the tracking signals.

19. The method of claim 18, further comprising:
in response to toggling the complementary first and second input signals, changing a state of the complementary first and second output signals with a voltage swing between a low voltage of the high voltage domain and a high voltage of the high voltage domain.

20. The method of claim 18, wherein a low voltage of the high voltage domain and a high voltage of the low voltage domain are approximately equal.

* * * * *